United States Patent [19]

Ghisio

[11] Patent Number: 4,769,562

[45] Date of Patent: Sep. 6, 1988

[54] DYNAMIC PROGRAMMABLE LOGIC ARRAYS WITH NOR-NOR STRUCTURE IMPLEMENTED IN C-MOS TECHNOLOGY

[75] Inventor: Guido Ghisio, Turin, Italy

[73] Assignee: CSELT - Centro Studi E Laboratori Telecommuniazioni S.p.A., Ivrea, Italy

[21] Appl. No.: 79,830

[22] Filed: Jul. 30, 1987

[30] Foreign Application Priority Data

Aug. 4, 1986 [IT] Italy ............................ 67627 A/86

[51] Int. Cl.⁴ ................. H03K 19/096; H03K 19/177
[52] U.S. Cl. .................................. 307/469; 307/443; 307/465; 307/481; 307/585
[58] Field of Search ............... 307/443, 448, 465, 468, 307/469, 451, 481, 584, 585, 241, 269; 364/716

[56] References Cited

U.S. PATENT DOCUMENTS

| | | | |
|---|---|---|---|
| 4,420,695 | 12/1983 | Fisher | 307/242 |
| 4,501,977 | 2/1985 | Koike | 307/469 |
| 4,569,032 | 2/1986 | Lee | 307/481 X |
| 4,668,880 | 5/1987 | Shoji | 307/469 |
| 4,697,105 | 9/1987 | Moy | 307/465 |
| 4,700,088 | 10/1987 | Tubbs | 307/468 X |
| 4,710,650 | 12/1987 | Shoji | 307/451 X |

FOREIGN PATENT DOCUMENTS

| | | | |
|---|---|---|---|
| 0219848 | 4/1987 | European Pat. Off. | 307/448 |
| 0075832 | 5/1978 | Japan | 307/469 |

OTHER PUBLICATIONS

"Principles of C-MOS VLSI Design", by N. H. Weste and K. Eshragian, Addison-Wesley, 1985, Chapter 8, pp. 368–379.

"The Design and Analysis of VLSI Circuits", by L. A. Glasser and D. N. Dobberpuhl, Addison-Wesley, 1985, Chapter 7, pp. 383–388.

Primary Examiner—Stanley D. Miller
Assistant Examiner—D. R. Hudspeth
Attorney, Agent, or Firm—Herbert Dubno

[57] ABSTRACT

The blocking circuits which, during precharge, inhibit the data passage to the AND and OR planes of a dynamic programmable logic array with NOR-NOR structure, implemented in C-MOS technology, comprise a pair of transistors with complementary channel doping, the first of which controls the signal passage to the AND or the OR plane, respectively, and the second inhibits the gates of the respective plane during precharge.

9 Claims, 2 Drawing Sheets

DYNAMIC PROGRAMMABLE LOGIC ARRAYS WITH NOR-NOR STRUCTURE IMPLEMENTED IN C-MOS TECHNOLOGY

FIELD OF THE INVENTION

My present invention relates to programmable logic arrays or PLAs and, more particularly, to programmable logic arrays with a NOR-NOR structure, implemented in C-MOS technology.

BACKGROUND OF THE INVENTION

As is known, programmable logic arrays basically comprise: an input latch, controlled by a first timing signal; a so-called "AND plane" effecting logic products of the input signals thereby generating the "product terms"; a so-called "OR plane" effecting logic sums of the product terms; and an output latch, controlled by a second timing signal. In dynamic logic arrays, logic operations and signal extraction take place in dependence upon a suitable control signal.

Nowadays such logic arrays are implemented in C-MOS technology, which is low-consuming and highly reliable.

For applications in which the operating rate of a dynamic logic array is important, precharge (or predischarge) schemes are used, wherein each output of the AND and OR planes is previously charged (discharged) by a transistor. This scheme requires the presence of a control or blocking circuit at the input of the AND and OR planes, which circuit sets the input signals to such a value that the output previously charged (discharged) cannot be significantly discharged (charged) owing to fluctuations of the input signals.

For high-speed precharge schemes, AND and OR functions are obtained by the use of NOR gates (hence the definition of NOR-NOR structure), and in these types of arrays the suitable value of the input signals is determined by combining input and enabling signals in NOR logic gates. This approach is described e.g. in *Principles of C-MOS VLSI Design* by N. H. Weste and K. Eshraghian, Addison-Wesley, 1985, Chapter 8, pages 368-379, and in *The Design and Analysis of VLSI Circuits,* by L. A. Glasser and D. N. Dobberpuhl, Addison-Wesley, 1985, Chapter 7, pages 383-388.

However, these systems have the disadvantage of decreasing the operation rate, since two transistors in series are always present, and of requiring a considerable area occupancy, depending on the number of transistors forming a NOR gate.

OBJECT OF THE INVENTION

It is an object of my invention to provide an improved PLA in which the blocking circuits are implemented by structures which do not present transistors in series typical of C-MOS static combinatory logics and use a number of transistors lower than that required by NOR gates, thereby overcoming the aforedescribed drawbacks.

SUMMARY OF THE INVENTION

The invention provides a precharge dynamic programmable logic array, implemented in C-MOS technology, comprising a first latch acting as input element of the array, the first and a second set of logic NOR gates for performing logic products of the array input signals and logic sums of said products, respectively, a second latch, acting as output element of the array.

A first and a second blocking circuit are connected between the first latch and the first set of NOR gates and between the latter and the second set of NOR gates, respectively, and are arranged to inhibit the signal transfer to the first and second set of NOR gates, when a first and a second control signals, controlling the precharge in said first and second sets of NOR gates, present a logic value allowing such a precharge.

These blocking circuits comprise each as many elements as are the signals to be transferred to the first and respectively the second set of NOR gates. Each element of the first blocking circuit consists of a first and a second transistor with complementary channel doping, the first of which has source and drain electrodes connected in series with the signal transfer line and is inhibited when the first control signal is at said logic level, while the second transistor has one of the source and drain electrodes grounded and the other connected to the electrode of the first transistor connected to the first set of NOR gates and inhibits the gates in said first set of NOR gates when the first control signal is at said logic level. Each element of the second blocking circuit comprises at least a third and fourth transistor with complementary channel doping, the third transistor having source and drain electrodes connected in series with the line transferring from the first to the second set of NOR gates one of the products effected, while the fourth transistor presents source and drain electrodes one of which is grounded and the other is connected to the electrode of the third transistor connected to the second set of logic gates and inhibits the gates of said second set when the second control signal is at said logic value.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
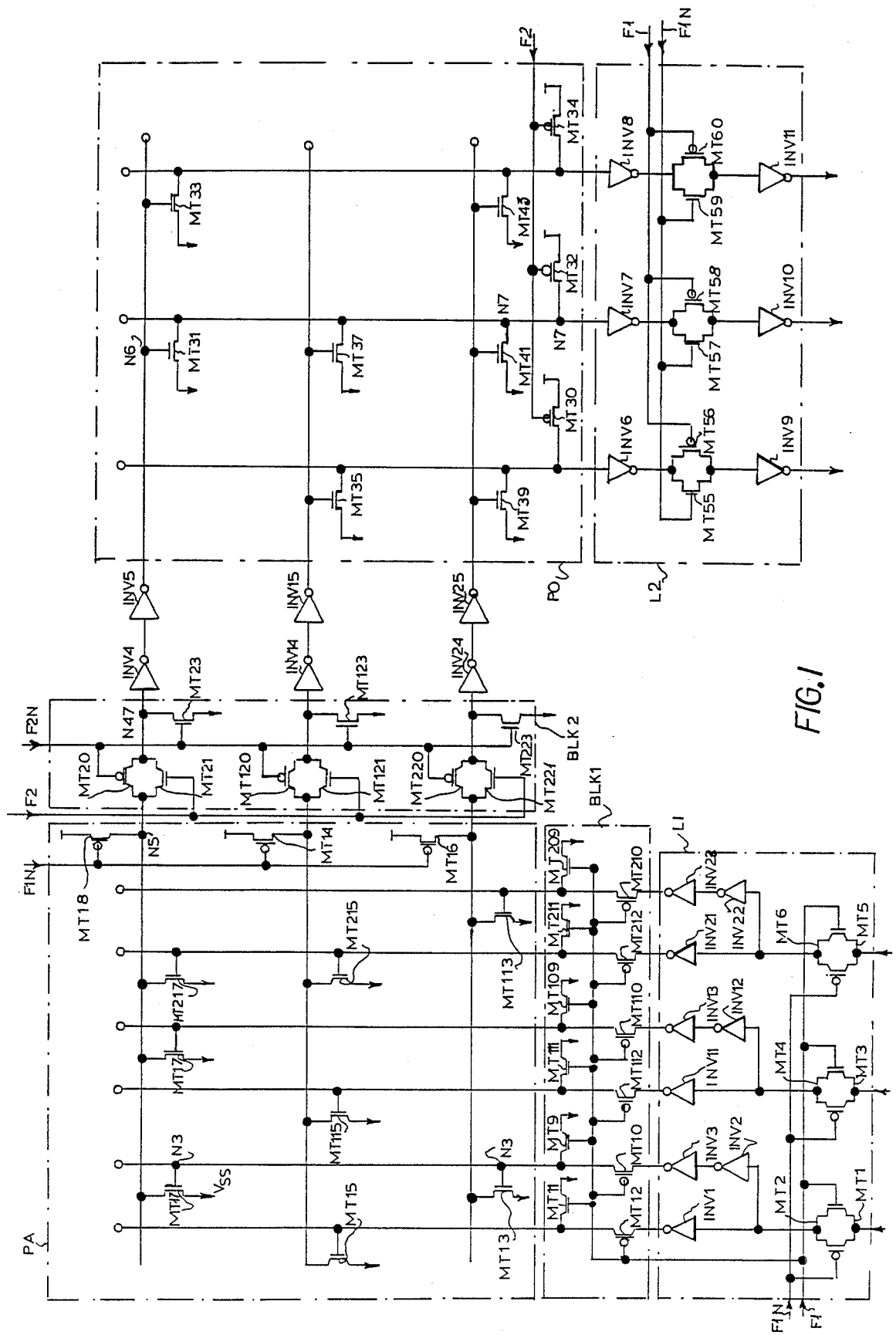
FIG. 1 is a circuit diagram illustrating the invention.

FIG. 1 shows a programmable logic array with three inputs and three product terms implementing a D-type master-slave register. The array consists of input latch L1, AND plane PA, OR plane PO, output latch L2 and blocking circuits BLK1, BLK2 connected between L1 and PA and between PA and PO.

Input latch L1 comprises three pairs of transistors MT1-MT2, MT3-MT4, MT5-MT6, associated with inverters INV1, INV2, INV3 and respectively INV11 to INV13 and INV21 to INV23; the second and third inverters of each set, in series with each other, supply the "true" signal, while the first supplies the "complement" signal.

The transistors in L1 are driven by timing signals or phases F1, F1N, which are complementary to each other. Blocking circuit BLK1 comprises six elements, one for each output of L1; each element comprises a p-channel transistor MT10 (MT12, MT110, MT112, MT210, MT212) and an n-channel transistor MT9 (and respectively MT11, 109, 111, 209, 211) driven by signal F1.

Depending on the logic value of control signal F1, the p-channel transistor of each element enables or inhibits, respectively, data transfer from the output of L1 to the input of the AND plane PA, while the n-channel transistor inhibits or enables, respectively, the transistors connected to it in PA. For the arrangement described for first blocking circuit BLK1, transistors MT10, MT12 . . . are advantageously of p-channel type, whereby a reduced body effect is obtained with respect to n-channel transistors, while transistors MT9, MT11 . . . should be of n-type to achieve cut off of the AND plane transistors.

AND plane PA comprises three NOR gates consisting of transistors MT17, MT117, MT217, MT18; MT15, MT215, MT14; MT13, MT113, MT16.

Transistors MT14, MT18, MT16 are the precharge transistors, controlled by signal F1N.

A pair of inverters INV4, INV5 (and respectively INV14, INV15 and INV24, INV25) are connected in each of the lines conveying the product terms to the OR plane in order to introduce a certain delay necessary to the correct driving of the OR plane lines, while ensuring at the same time that a same logic value is present at the output of the AND plane and at the input of the OR plane PO.

Blocking circuit BLK2, which is advantageously placed upstream the inverter pairs, for reasons which will be explained later, comprises an element for each one of the lines conveying the product terms to the OR plane PO. Each element comprises a p-channel transistor MT20 (MT120, MT220) and an n-channel transistor MT23 (MT123, MT223), having the same functions as the p-channel and n-channel transistors in the elements of the BLK1, and a further n-type transistor MT21 (MT121, MT221), connected in the same way as MT20 (120, 220) and forming therewith a C-MOS transfer gate. The functions of MT21 will be elucidated while describing the circuit operation. Transistor MT21 and the analogous ones on the other lines are driven by signal F2 (which basically coincides with F1N), while the transistor pairs like MT20, MT23 are driven by F2N, in the same way as pairs MT9–MT10, etc. are driven by F1.

Second blocking circuit BLK2 has been connected upstream the two inverters and not downstream or in an intermediate position for reasons depending on the delay which must separate the logic states of F1 and F2. In fact, by the arrangement shown, such a delay is equal to the discharge time at node N47 common to MT20, MT21 and MT23, while in the other cases the delay introduced by the inverters is to be added. This approach allows F2, F2N to be obtained from the same generator as F1, by exploiting propagation delays through the circuit.

OR plane PO, like AND plane PA, is implemented by NOR gates represented by three sets of transistors MT33, MT43; MT31, MT37, MT41, MT42; MT35, MT39, MT30. Transistors MT32, MT32, MT34 are the precharge transistors, driven by signal F2.

Output latch L2, of the double inverter type, comprises the pairs of transistors MT55, MT56; MT57, MT58; MT59, MT60, connected between inverters INV6, INV9 and respectively INV7, INV10 and INV8, INV11. Latch L2 is controlled by signals F1, F1N.

As to the circuit operation, only the aspects concerning the presence of BLK1, BLK2 will be investigated here, since input/output latch and AND/OR plane operations are completely conventional.

As mentioned, blocking circuits BLK1, BLK2 prevent input signals of PA, PO from acting during the precharge. Since all elements of BLK1 or BLK2 are identical, only one will be described, namely the one composed by MT9, MT10 for BLK1, and MT20, MT21, MT23 for BLK2.

In circuit BLK1, when F1 goes to logic value "1", the passage through MT10 of the datum present at the output of INV3 is inhibited and voltage Vss (0 Volt) is forced on node N3 by n-channel transistor MT9, thus avoiding discharge of node N5.

When F1 goes to logic value "0", the transfer of the datum present at the output of INV3 is enabled and at the same time the connection with supply voltage Vss is interrupted.

If the signal which thus propagates to node N3 is "0", node N5 remains charged (logic "1"). In the opposite case, transistor MT17 connects node N5 to supply voltage Vss, thus discharging that node.

In circuit BLK2 transistors MT20, MT23 operate in the same way as MT10, MT9, depending on the logic value of F2N and of the signals present in node N5.

For a correct array operation, transistor MT20 is to be activated only when the discharge at node N5 has reached significant levels, otherwise the risk exists of propagating to OR plane, beyond the pair of inverters INV4, INV5, the precharge datum which would activate transistor MT3, thus causing a non-significant discharge of node N7, which discharge is irreversible for the considered cycle. This can be avoided thanks to the fact that the precharge of MT18 and the activation of MT20 are controlled by different signals (F1N and F2N respectively).

Besides, notwithstanding the difference of the activation instands of MT18 and MT20 upon discharge of MT17, a portion of the voltage present at node N5 can be transferred to node N47, which is thus temporarily charged by a non-significant signal. The entity of such a voltage redistribution depends on the parasitic capacitances present at the nodes considered and is the more limited the more the ratio C(N5)/C(N47) is limited.

Since transistor MT20 is of p-channel type, upon a possible charge overflow from node N5 to node N47, low voltage values, corresponding to logic state "0", could be attained too slowly at the input of INV4. Such a phenomenon, due to the operation of p-channel transistor MT20 at the conductivity limits, can be eliminated by connecting, in parallel with such a transistor, n-channel transistor MT21, which may be even of minimum size, so as not to be detrimental to area occupancy.

Figure 2:
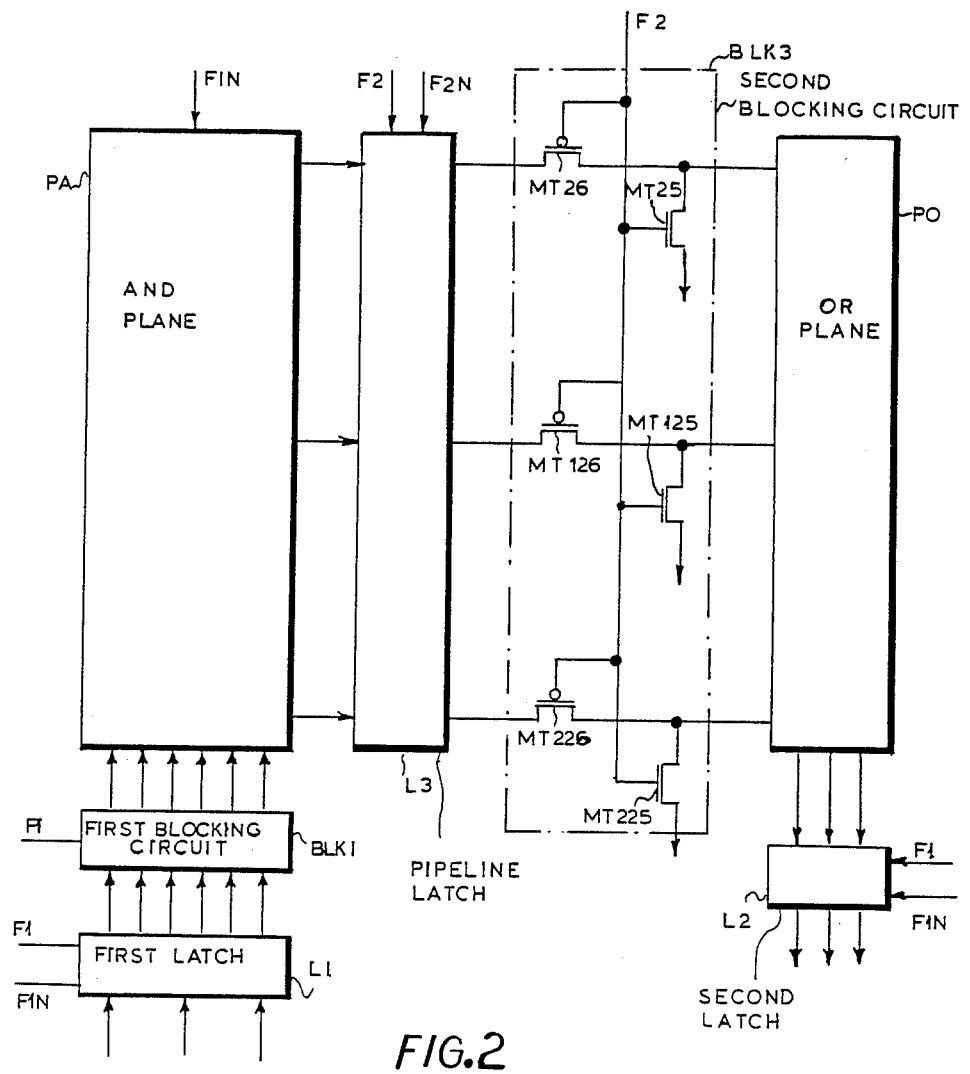
FIG. 2 is a block diagram showing circuit elements in a modification.

FIG. 2 shows a second example of a programmable logic array, also having 3 inputs, 3 outputs and 3 product terms, which operates as a double D-type master-slave register.

In FIG. 2 L1, BLK1, PA, PO, L2, F1, F1N, F2, F2N denote the same devices and signals already described with reference to FIG. 1. L3 is a further latch (pipeline latch) connected to the output of the AND plane. Latch L3 has the same structure as L2 and is controlled by signals F2, F2N.

BLK3 is the blocking circuit controlling data transfer to OR plane: in this type of application, BLK3 is identical to BLK1 and comprises, for each of the lines conveying the product terms to PO, a p-channel transistor MT26 (MT126, MT226) and an n-channel transistor MT25 (MT125, MT225).

The two transistors are driven by F2, in the same way as F1 drives the transistors of BLK1.

Owing to the presence of L3, the voltage redistribution among the points corresponding to nodes N5 and N47 of FIG. 1 no longer occurs, and hence the presence of the further n-channel transistor is no longer required in BLK3.

The locations of blocking circuits BLK1, BLK3 with respect to the inverters in L1, L3, or the location of blocking circuits BLK2 with respect to inverters INV4, INV5, etc., can be changed if desired and p-channel and n-channel transistors can possibly be mutually exchanged, with a corresponding variation of connections of supplies and phases.

I claim:

1. A C-MOS dynamic programmable logic array, comprising:
    a first latch forming an input element of the array;
    a first and second set of logic NOR gates for respectively forming logic products of input signals applied to said first latch and logic sums of said products;
    a second latch connected to said second set of logic NOR gates and forming an output element of said array;
    a first blocking circuit connected between said first latch and said first set of logic NOR gates for inhibiting signal transfer to said first set of logic NOR gates when a first control signal for said first set of logic NOR gates presents a given logic value, said first blocking circuit including:
        a respective pair of transistors with complementary channel doping for each input to said first set of logic NOR gates from said first latch, a first transistor of each pair having source and drain electrodes in series with a signal transfer line leading to a respective input of said first set of logic NOR gates from said first latch and being inhibited when said first control signal is at said given logic value, a second transistor of each pair having one of its source and drain electrodes grounded and the other of its source and drain electrodes connected to an electrode of the respective first transistor of the pair which is connected to said first set of logic NOR gates and inhibiting the gates of said first set of logic NOR gates when said first control signal is at said given logic value; and
    a second blocking circuit connected between said first set of logic NOR gates and said second set of logic NOR gates for inhibiting signal transfer from said first set of logic NOR gates to said second set of logic NOR gates when a second second control signal presents a predetermined logic value, said second blocking circuit including:
        respective pairs of transistors with complementary channel doping including a third transistor of each pair of transistors of the second blocking circuit having source and drain electrodes in series with a line transferring a respective one of the products formed in said first set of logic NOR gates to said second set of logic NOR gates, and a fourth transistor of each pair of transistors of the second blocking circuit having one of its source and drain electrodes grounded and the other connected to the electrode of the respective third transistor connected to said second set of logic NOR gates and which inhibits the gates of said second set of logic NOR gates in correspondence with said predetermined logic value of said second control signal.

2. The C-MOS dynamic programmable logic array defined in claim 1 wherein said first and second control signals are applied to said first and second blocking circuits to control precharge or predicharge states in said first and second sets of logic NOR gates.

3. The C-MOS dynamic programmable logic array defined in claim 1 wherein each of said pairs of transistors of said second blocking circuit is connected with a respective fifth transistor with channel doping identical to that of the respective fourth transistor and in parallel with the respective third transistor to recover charge overflow from said first set of logic NOR gates to said second set of logic NOR gates.

4. The C-MOS dynamic programmable logic array defined in claim 1 wherein each of said first transistors is a p-channel transistor and each of said second transistors is an n-channel transistor.

5. The C-MOS dynamic programmable logic array defined in claim 1 wherein each of said third transistors is a p-channel transistor and each of said fourth transistors is an n-channel transistor.

6. In a precharge or pre-discharge dynamic programmable logic array, implemented in C-MOS technology, comprising a first latch (L1), acting as input element of the array, a first and a second set of logic NOR gates (PA, PO) for performing logic products of the array input signals and logic sums of said products, respectively, a second latch (L2), acting as output element of the array, and a first and a second blocking circuit (BLK1, BLK2; BLK1, BLK3), which are connected between the first latch (L1) and the first set of NOR gates (PA), and between the first (PA) and the second set of NOR gates (PO), respectively, are designed to inhibit the signal transfer to the first and the second set of NOR gates (PA, PO), when a first and a second control signal (F1, F2), controlling the precharge or pre-discharge in said first and second sets of NOR gates, present a logic value allowing such a precharge or pre-discharge, and comprise each as many elements as are the signals to be transferred to the first and respectively the second set of NOR gates (PA, PO), the improvement wherein each element of the first blocking circuit (BLK1) consists of a pair of transistors with complementary channel doping (MT10, MT9; MT12, MT11; MT110, MT109; MT112, MT111; MT210; MT209; MT212, MT211), the first of which has source and drain electrodes in series with the signal transfer line and is inhibited when the first control signal (F1) is at said logic level, while the second transistor has one of source and drain electrodes grounded and the other connected to the electrode of the first transistor connected to the first set of NOR gates (PA), and inhibits the gates of said first set of NOR gates (PA) when the first control signal is at said logic level, and in that each element of the second blocking circuit (BLK2, BLK3) comprises at least a third and a fourth transistor with complementary channel doping (MT20, MT23; MT120, MT220, MT223; MT26, MT25; MT126, MT125, MT226, MT225), of which the third (MT20, MT120, MT220, MT26, MT126, MT226) has source and drain electrodes in series with the line transferring one of the products effected from the first to the second set of NOR gates (PA, PO), and the fourth transistor (MT23, MT123, MT223, MT25, MT125, MT225) presents one of the source and drain electrodes grounded and the other connected to the electrode of the third transistor connected to the second set of logic gates (PO) and inhibits the gates of said second set in correspondence with said logic value of the second control signal.

7. The improvement defined in claim 6 wherein each element of said second blocking circuit (BLK2) comprises afifth transistor (MT21, MT122, MT221), with channel doping equal to that of the fourth transistor and connected in parallel to the third transistor (MT20, MT120, MT220), to recover charge overflows from the first towards the second NOR gate set (PA, PO).

8. The improvement defined in claim 6 characterized in that said first transistor (MT10, MT12, MT110, MT112, MT210, MT212) is a p-channel transistor and said second transistor (MT9, MT11, MT109, MT111, MT209, MT211) is an n-channel transistor.

9. The improvement defined in claim 6 wherein that said third transistor (MT20, MT120, MT220, MT26, MT126, MT226) is a p-channel transistor, and said fourth and fifth transistors (MT21, MT23; MT121, MT123; MT221, MT223) are n-channel transistors.

* * * * *